US012112948B2

(12) United States Patent
Koh et al.

(10) Patent No.: US 12,112,948 B2
(45) Date of Patent: Oct. 8, 2024

(54) METHOD OF MANUFACTURING INTEGRATED CIRCUIT DEVICE USING A METAL-CONTAINING PHOTORESIST COMPOSITION

(71) Applicant: SAMSUNG ELECTRONICS CO., LTD., Suwon-si (KR)

(72) Inventors: Chawon Koh, Yongin-si (KR); Soyeon Yoo, Hwaseong-si (KR); Sooyoung Choi, Hwaseong-si (KR); Tsunehiro Nishi, Seongnam-si (KR); Kwangsub Yoon, Yongin-si (KR); Brian Cardineau, Corvallis, OR (US); Kumagai Tomoya, Kanagawa (JP)

(73) Assignees: Samsung Electronics Co., Ltd. (KR); Inpria Corporation, Corvallis, OR (US); Tokyo Ohka Kogyo Co., Ltd., Kanagawa (JP)

(*) Notice: Subject to any disclaimer, the term of this patent is extended or adjusted under 35 U.S.C. 154(b) by 950 days.

(21) Appl. No.: 16/996,372

(22) Filed: Aug. 18, 2020

(65) Prior Publication Data
US 2022/0059345 A1 Feb. 24, 2022

(51) Int. Cl.
 *G03F 7/38* (2006.01)
 *G03F 7/004* (2006.01)
 *H01L 21/027* (2006.01)
(52) U.S. Cl.
 CPC ........ *H01L 21/0274* (2013.01); *G03F 7/0042* (2013.01); *G03F 7/38* (2013.01)

(58) Field of Classification Search
 CPC ........... G03F 7/0042; G03F 7/168; G03F 7/38
 See application file for complete search history.

(56) References Cited

U.S. PATENT DOCUMENTS

| 5,747,221 | A | * | 5/1998 | Kim ................... G03F 7/70283 |
|---|---|---|---|---|
| | | | | 430/311 |
| 7,247,575 | B2 | | 7/2007 | Cheng et al. |
| 8,826,926 | B2 | | 9/2014 | Chalom et al. |
| 9,508,558 | B2 | | 11/2016 | Lin |
| 9,885,955 | B2 | | 2/2018 | Lee et al. |
| 10,025,179 | B2 | | 7/2018 | Meyers et al. |
| 2012/0108067 | A1 | | 5/2012 | Neisser et al. |
| 2018/0046086 | A1 | | 2/2018 | Waller et al. |
| 2018/0147599 | A1 | * | 5/2018 | Tanaka ............. H01L 21/68707 |
| 2019/0041754 | A1 | | 2/2019 | Harumoto et al. |
| 2019/0043710 | A1 | * | 2/2019 | Chen ................ H01L 21/26513 |

(Continued)

FOREIGN PATENT DOCUMENTS

| JP | 2006-80298 A | 3/2006 |
|---|---|---|
| JP | 2017-98367 A | 6/2017 |
| KR | 10-2002-0063096 A | 8/2002 |

(Continued)

*Primary Examiner* — Daborah Chacko-Davis
(74) *Attorney, Agent, or Firm* — Myers Bigel, P.A.

(57) ABSTRACT

In a method of manufacturing an integrated circuit device, a photoresist layer is formed by coating a photoresist composition on a substrate having a main surface and an edge portion surrounding the main surface. A portion of the photoresist layer is removed from the edge portion of the substrate. After the portion of the photoresist layer is removed, the substrate is processed using a main treatment composition including an organic solvent, acid, and water.

12 Claims, 12 Drawing Sheets

(56) References Cited

U.S. PATENT DOCUMENTS

2019/0317407 A1   10/2019   Mizunoura et al.

FOREIGN PATENT DOCUMENTS

| KR | 10-2016-0072628 A | 6/2016 |
| KR | 10-1670239 B1 | 10/2016 |
| KR | 10-2018-0050978 A | 5/2018 |
| KR | 10-2018-0050979 A | 5/2018 |
| KR | 10-1910157 B1 | 10/2018 |
| WO | 2018/031896 A1 | 2/2018 |

* cited by examiner

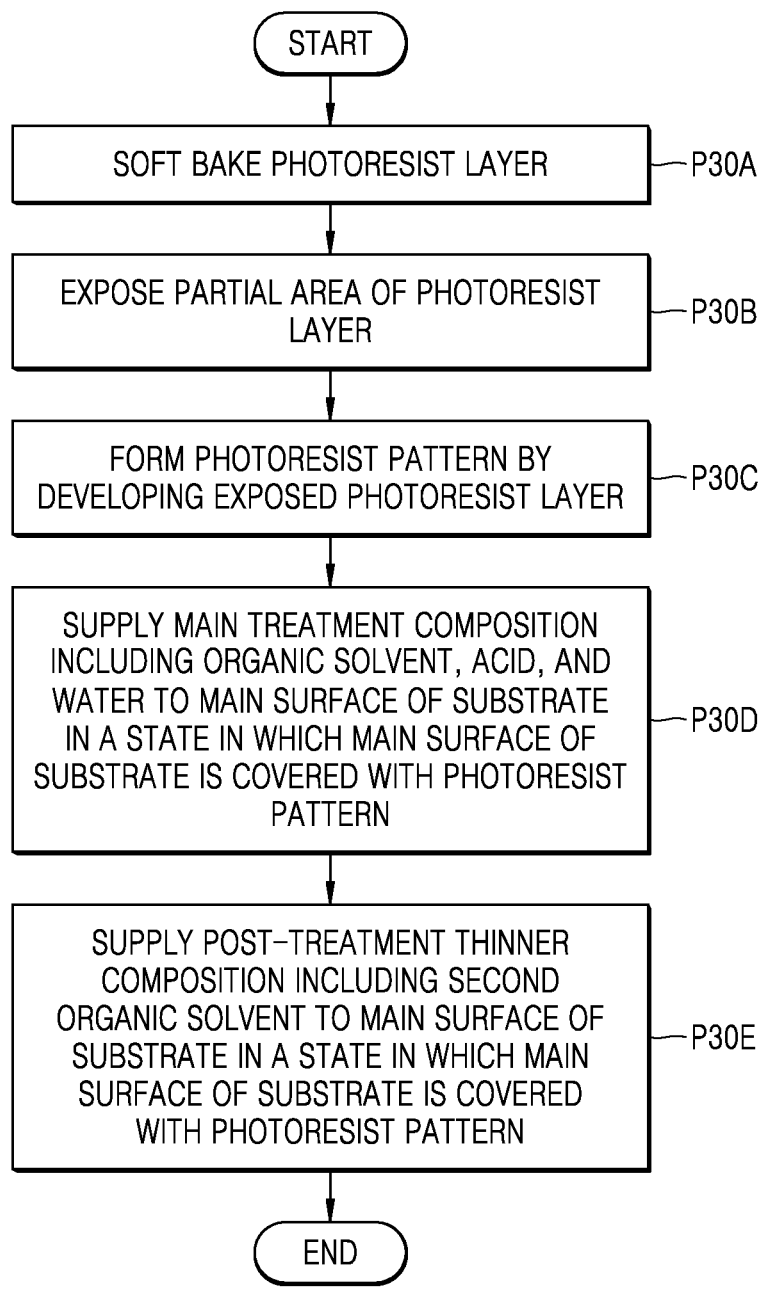

FIG. 6A
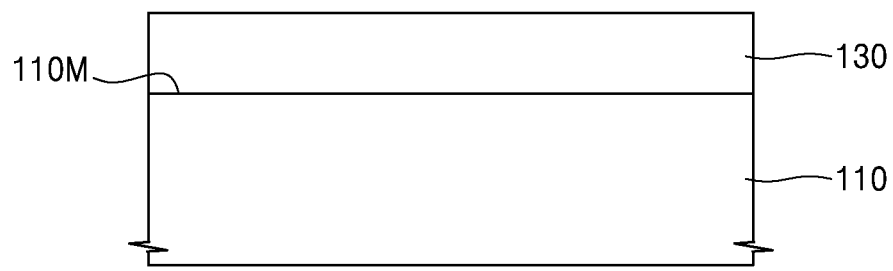
FIG. 6B
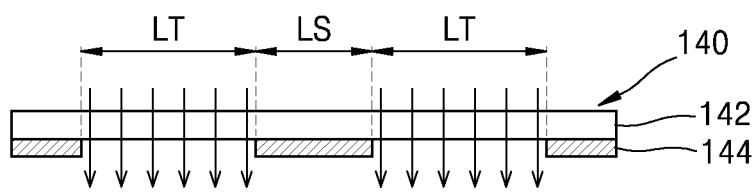
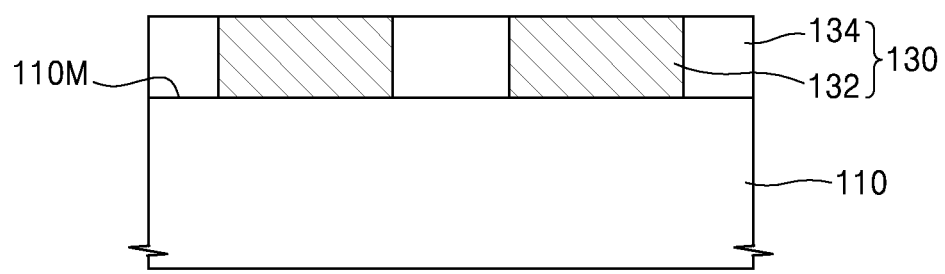

METHOD OF MANUFACTURING INTEGRATED CIRCUIT DEVICE USING A METAL-CONTAINING PHOTORESIST COMPOSITION

BACKGROUND

The inventive concept relates to a method of manufacturing an integrated circuit device, and more particularly, to an integrated circuit device using a metal-containing photoresist composition and a method of manufacturing the same.

Due to the development of electronic technologies, semiconductor devices have been rapidly down-scaled in terms of size. Therefore, a photolithography process for implementing a fine pattern is needed. In particular, in the photolithography process in which the metal-containing photoresist composition is used, new technologies for preventing an integrated circuit device from being contaminated by the metal included in the photoresist composition and preventing electrical characteristics of the integrated circuit device from deteriorating due to the contamination are being developed.

SUMMARY

The inventive concept relates to a method of manufacturing an integrated circuit device capable of preventing an integrated circuit device from being contaminated by metal generated by a photoresist composition and preventing electrical characteristics of the integrated circuit device from deteriorating due to the contamination in processes of manufacturing the integrated circuit device by using a photolithography process in which a metal-containing photoresist composition is used.

According to some embodiments of the inventive concept, there is provided a method of manufacturing an integrated circuit device. In the method, a photoresist layer is formed by coating a photoresist composition on a substrate having a main surface and an edge portion around the main surface in a plan view. A portion of the photoresist layer is removed from the edge portion of the substrate. After the portion of the photoresist layer is removed, the substrate is processed using a main treatment composition including an organic solvent, acid, and water.

According to some embodiments of the inventive concept, there is provided a method of manufacturing an integrated circuit device. The method includes, forming a metal-containing photoresist layer by coating a metal-containing photoresist composition on a substrate having a main surface and an edge portion around the main surface in a plan view. A portion of the metal-containing photoresist layer is removed from the edge portion of the substrate. Impurities are removed from a surface of the substrate by supplying a main treatment composition including an organic solvent, acid, and water to the substrate after the portion of the metal-containing photoresist layer is removed.

According to some embodiments of the inventive concept, there is provided a method of manufacturing an integrated circuit device. In the method, a metal-containing photoresist layer is formed by coating a metal-containing photoresist composition on a substrate having a main surface and an edge portion around the main surface in a plan view. A thinner composition including a first organic solvent is supplied to the edge portion of the substrate in order to remove a portion of the metal-containing photoresist layer that is on the edge portion of the substrate. A main treatment composition including a second organic solvent, acid, and water is supplied to the edge portion of the substrate in a state in which the main surface of the substrate is overlapped by the metal-containing photoresist layer to remove metallic impurities from the edge portion of the substrate after the supplying of the thinner composition. A post-treatment thinner composition including a third organic solvent is supplied to the edge portion of the substrate in a state in which the main surface of the substrate is overlapped by the metal-containing photoresist layer to remove reactive impurities residing on the edge portion of the substrate after the supplying of the main treatment composition.

BRIEF DESCRIPTION OF THE DRAWINGS

Embodiments of the inventive concept will be more clearly understood from the following detailed description taken in conjunction with the accompanying drawings in which:

FIG. 2A is a schematic perspective view of a substrate and FIGS. 2B to 2E are cross-sectional views illustrating a partial area of a substrate and components around the substrate in the order of processes to describe the method of manufacturing an integrated circuit device of FIG. 1 in detail;

FIG. 5 is a flowchart illustrating an example method of forming a photoresist pattern by the method of manufacturing an integrated circuit device of FIG. 3; and FIGS. 6A to 6E are cross-sectional views illustrating partial processes of the method of manufacturing an integrated circuit device of FIG. 5, that is, cross-sectional views illustrating an example method of forming a photoresist pattern from a photoresist layer on a substrate in the order of processes, according to some embodiments of the inventive concept.

DETAILED DESCRIPTION

Figure 1:
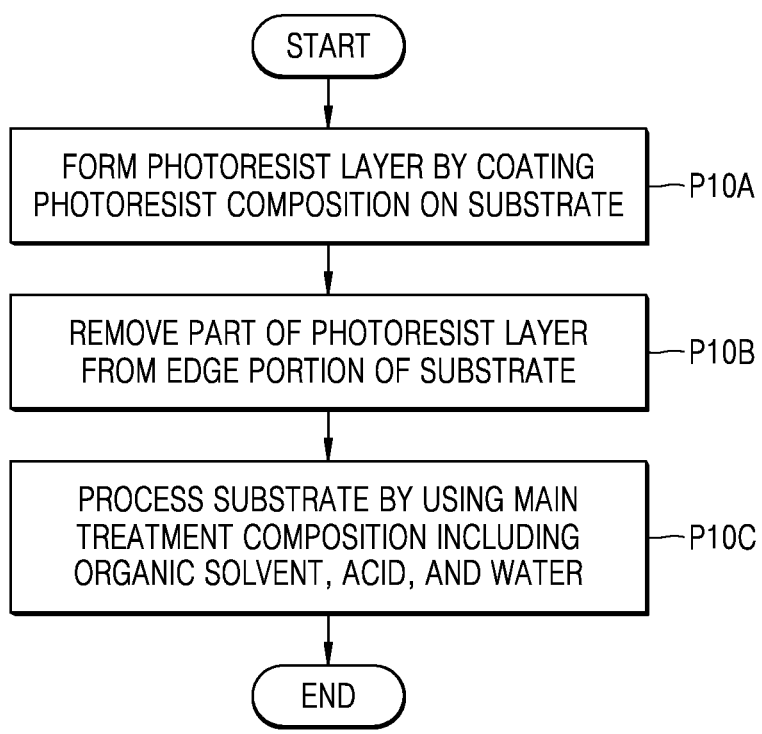
FIG. 1 is a flowchart illustrating a method of manufacturing an integrated circuit device, according to embodiments of the inventive concept.

Hereinafter, embodiments of the inventive concept will be described in detail with reference to the accompanying drawings Like reference numerals refer to like elements throughout and previously given description will be omitted.

FIG. 1 is a flowchart illustrating a method of manufacturing an integrated circuit device, according to embodiments of the inventive concept.

Figure 2A:
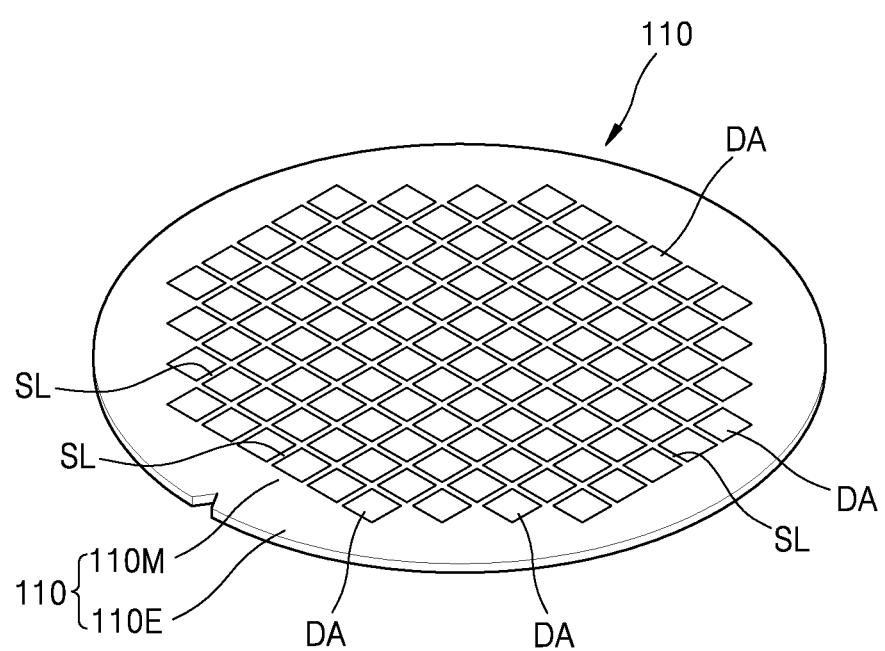
FIGS. 2A to 2E are views illustrating a method of manufacturing an integrated circuit device, according to embodiments of the inventive concept.

FIGS. 2A to 2E are views illustrating a method of manufacturing an integrated circuit device, according to embodiments of the inventive concept. FIG. 2A is a schematic perspective view of a substrate 110 and FIGS. 2B to 2E are cross-sectional views illustrating a partial area of the substrate 110 and components around the substrate 110 in the order of processes to describe the method of manufacturing an integrated circuit device of FIG. 1 in detail.

First, referring to FIG. 2A, substrate 110, having a main surface 110M and an edge portion 110E surrounding the main surface 110M is provided.

The substrate 110 may include a semiconductor substrate. In some embodiments, the semiconductor substrate may be formed of a semiconductor element such as silicon (Si) or germanium (Ge). In some embodiments, the semiconductor substrate may be formed of a compound semiconductor such as SiGe, SiC, GaAs, InAs, or InP. In some embodiments, the semiconductor substrate may have a silicon on insulator (SOI) structure. The substrate 110 may include a process film formed on the semiconductor substrate. The process film may be an insulating layer or a conductive layer. For example, the process film may be formed of metal, an alloy, metal carbide, metal nitride, metal oxynitride, metal oxycarbide, a semiconductor, polysilicon, oxide, nitride, oxynitride, or a combination of the above materials. However, the inventive concept is not limited thereto. In the substrate 110, at least a part of the process film and the semiconductor substrate may be a film to be processed.

The main surface 110M of the substrate 110 may include a plurality of semiconductor die areas DA. The plurality of semiconductor die areas DA, in each of which a semiconductor die may be formed, may be separated from each other by a scribe lane SL. In each of the plurality of semiconductor die areas DA, a semiconductor device including various kinds of a plurality of individual devices is formed. The plurality of individual devices may include various microelectronic devices such as, for example, a metal-oxide-semiconductor field effect (MOSFET) transistor such as a complementary metal-insulator-semiconductor (CMOS) transistor, an image sensor such as a system large scale integration (LSI) or a CMOS imaging sensor (CIS), a micro-electro-mechanical system (MEMS), an active device, and/or a passive device. Each of the plurality of semiconductor die areas DA may be for forming a memory semiconductor chip. In some embodiments, each of the plurality of semiconductor die areas DA may be used for forming a volatile memory semiconductor chip such as dynamic random access memory (DRAM) or static random access memory (SRAM) or a non-volatile memory semiconductor chip such as phase-change random access memory (PRAM), magnetoresistive random access memory (MRAM), ferroelectric random access memory (FeRAM), and/or resistive random access memory (RRAM).

Figure 2B:
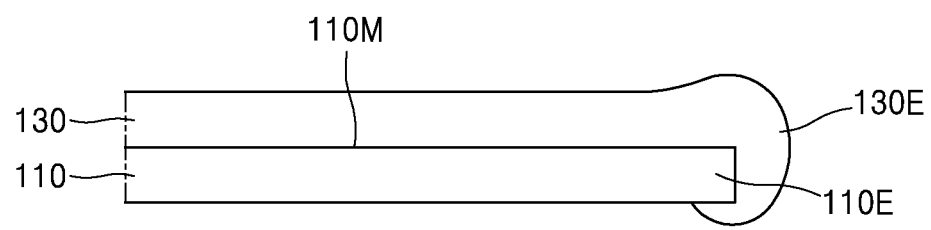

Referring to FIGS. 1 and 2B, in operation P10A, a photoresist layer 130 is formed by coating a photoresist composition on the substrate 110. In FIG. 2B, a cross-section illustrating the partial area of the substrate 110 including the edge portion 110E and a part or portion of the photoresist layer 130 is illustrated.

In some embodiments, a process of forming a resist sub-layer (not shown) on the substrate 110 before forming the photoresist layer 130 on the substrate 110 may be performed. The resist sub-layer may include an antireflection layer formed between the substrate 110 and the photoresist layer 130 to prevent irradiation reflected from a lower portion of the photoresist layer 130 from being scattered to the photoresist layer 130.

In order to form the photoresist layer 130, a spin coating process, a spray coating process, or a dip coating process may be used. However, a method of forming the photoresist layer 130 is not limited thereto.

In order to form the photoresist layer 130, the photoresist composition may be applied onto the substrate 110. The photoresist composition may be a metal-containing photoresist composition. The metal-containing photoresist composition may include a metal structure including an organic metal compound, an organic metal nanoparticle, or an organic metal cluster and/or an organic solvent.

The metal structure included in the metal-containing photoresist composition may include a metal core including at least one metal atom and at least one organic ligand surrounding the metal core. In the metal structure, between the metal core and the organic ligand, there may be an ionic bond, a covalent bond, a metal bond, or a van der Waals bond.

The metal core may include at least one metal atom including a metal atom, a metallic ion, a metal compound, a metal alloy, or a combination of the above materials. The metal compound may be formed of metal oxide, metal nitride, metal oxynitride, metal silicide, metal carbide, or a combination of the above materials. In some embodiments, the metal core may include at least one metal atom selected from tin (Sn), stibium (Sb), indium (In), bismuth (Bi), silver (Ag), tellurium (Te), gold (Au), plumbum (Pb), zinc (Zn), titanium (Ti), hafnium (Hf), zirconium (Zr), aluminum (Al), vanadium (V), chrome (Cr), cobalt (Co), nickel (Ni), copper (Cu), gallium (Ga), and iron (Fe). However, the inventive concept is not limited thereto.

In some embodiments, the organic ligand may include C1-C30 linear alkyl, C1-C30 branched alkyl, C3-C30 cycloalkyl, C2-C30 alkenyl, C2-C30 alkynyl, C6-C30 aryl, C3-C30 allyl, C1-C30 alkoxy, C6-C30 aryloxy, or a combination of the above compounds. The organic ligand may include a hydrocarbyl group substituted by at least one heteroatom functional group including an oxygen atom, a nitrogen atom, a halogen atom, cyano, thio, silyl, ether, carbonyl, ester, nitro, amino, or a combination of the above groups. The halogen atom may be fluorine (F), chlorine (Cl), bromine (Br), or iodine (I).

For example, the organic ligand may include methyl, ethyl, propyl, butyl, isopropyl, third butyl, third amyl, second butyl, cyclopropyl, cyclobutyl, cyclopentyl, or cyclohexyl. The metal structure may include a plurality of organic ligands, and two organic ligands among the plurality of organic ligands may form one cyclic alkyl moiety. The cyclic alkyl moiety may include 1-adamantyl or 2-adamantyl.

In some embodiments, the metal structure may be formed of (tBu)Sn(NEt$_2$)$_2$(OtBu), (tBu)Sn(NEt$_2$)(NH$_2$)(OtBu), (tBu)Sn(NEt$_2$)(OtBu)$_2$, (Me)Sn(NEt$_2$)(OtBu)$_2$, (Me)Sn(NEt$_2$)$_2$(OtBu), (tBu)$_2$Sn(NEt$_2$)(OtBu), (Me)$_2$Sn(NEt$_2$)(OtBu), (Me)(tBu)Sn(NEt$_2$)$_2$, (Me)(tBu)Sn(NEt$_2$)(OtBu), (iPr)(tBu)Sn(NMe$_2$)(OtBu), or a combination of the above compounds. However, the inventive concept is not limited thereto. Here, "Me" means methyl, "Et" means ethyl, and "tBu" means tertiary butyl.

The organic solvent included in the metal-containing photoresist composition may include at least one of ether, alcohol, glycol ether, an aromatic hydrocarbon compound, ketone, and/or ester. However, the inventive concept is not limited thereto. For example, the organic solvent may be formed of, ethylene glycol monomethyl ether, ethylene glycol monoethyl ether, methyl cellosolve acetate, ethyl cellosolve acetate, diethylene glycol methyl ether, diethylene glycol ethyl ether, propylene glycol, propylene glycol methyl ether (PGME), propylene glycol methyl ether acetate (PGMEA), propylene glycol ethyl ether, propylene glycol ethyl ether acetate, propylene glycol propyl ether acetate, propylene glycol butyl ether, propylene glycol butyl ether acetate, ethanol, propanol, isopropyl alcohol, isobutyl alcohol, hexanol, 1-methoxy-2-propanol, 1-etholy-2-propanol, ethylene glycol, propylene glycol, heptanone, propyl carbonate, butylene carbonate, toluene, xylene, methyl ethyl ketone, cyclopentanone, cyclohexanone, ethyl 2-hydroxy propionate, ethyl 2-hydroxy-2-methyl propionate, ethyl ethoxyacetate, ethyl hydroxylacetate, methyl 2-hydroxy-3-methyl butanoate, methyl 3-methoxy propionate, ethyl 3-methoxy propionate, ethyl 3-ethoxy propionate, methyl 3-ethoxy propionate, methyl pyruvate, ethyl pyruvate, ethyl acetate, butyl acetate, ethyl lactate, butyl lactate, gamma-butyrolactone, methyl-2-hydroxyisobutyrate, methoxybenzene, n-butyl acetate, 1-methoxy-2-propyl acetate, methoxy ethoxy propionate, ethoxy ethoxy propionate, or a combination of the above compounds.

When the photoresist composition is applied onto the substrate by a spin coating method in order to form the photoresist layer 130 by the operation P10A of FIG. 1, by centrifugal force, the photoresist composition may be concentrated onto the edge portion 110E of the substrate 110. Therefore, the photoresist layer 130 may include an edge bead portion 130E with a thickness greater on the edge portion 110E than in the other portions of the substrate 110. The edge bead portion 130E of the photoresist layer 130 may cover parts of, overlap, or be on side surfaces and a lower surface of the substrate 110 as well as an upper surface of the edge portion 110E of the substrate 110.

Figure 2C:
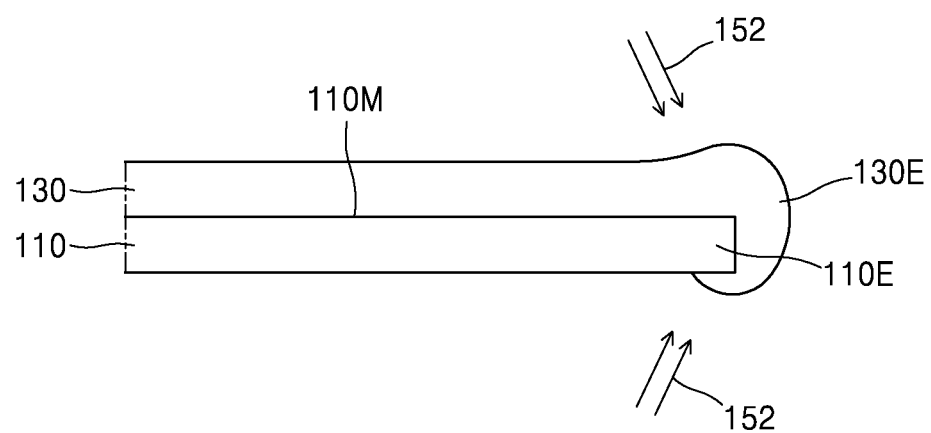
Figure 2D:
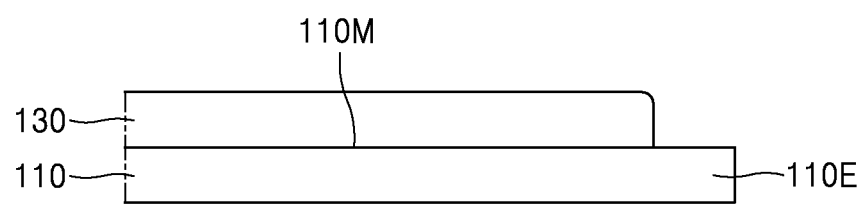

Referring to FIGS. 1, 2C, and 2D, in operation P10B, in the edge portion 110E of the substrate 110, a part or portion of the photoresist layer 130 is removed. For this purpose, as illustrated in FIG. 2C, the edge bead portion 130E of the photoresist layer 130 is removed by supplying a thinner composition 152 to the edge portion 110E of the substrate 110. As a result, as illustrated in FIG. 2D, around the photoresist layer 130, a surface of the edge portion 110E of the substrate 110 may be exposed.

The thinner composition 152 may include the organic solvent. In some embodiments, the thinner composition 152 may be formed of only the organic solvent. The organic solvent that may be included in the thinner composition 152 is almost the same as or similar to the organic solvent that may be included in the photoresist composition.

In some embodiments, a composition of the organic solvent included in the thinner composition 152 used in operation P10B of FIG. 1 may be the same as that of the organic solvent included in the photoresist composition. In some embodiments, the composition of the organic solvent included in the thinner composition 152 used in operation P10B of FIG. 1 may be different from that of the organic solvent included in the photoresist composition. For example, the organic solvent included in the thinner composition 152 may be formed of a composition of PGME and PGMEA. In this case, in the organic solvent, a weight ratio between PGME and PGMEA may be about 3:7 to about 5:5. For example, in the organic solvent, the weight ratio between PGME and PGMEA may be about 4:6.

In some embodiments, the thinner composition 152 may be formed of a combination of the organic solvent and water.

In some embodiments, the thinner composition 152 may further include at least one selected from a surfactant and a chelating agent.

The surfactant may be a cationic surfactant, an anionic surfactant, or an amphoteric surfactant. For example, the surfactant may be formed of polyethylene glycol tert-octylphenyl ether (Triton™ X-100), nonoxynol-9 (26-(4-nonylphenoxy)-3,6,9,12,15,18,21,24-octaoxahexacosan-1-ol), polysorbate (polyoxyethylene glycol sorbitan alkyl ester), sorbitan alkyl esters (Span®), poloxamers, block copolymer of polyethylene glycol and polypropylene glycol (Tergitol™), dioctyl sodium sulfosuccinate (DOSS), perfluorooctanesulfonate (PFOS), linear alkylbenzene sulfonate, sodium lauryl ether sulfate, lignosulfonate, sodium stearate, benzalkonium chloride (BAC), cetylpyridinium chloride (CPC), benzethonium chloride (BZT), cetyl trimethylammonium bromide (CTAB), cetyl trimethylammonium chloride (CTAC), (3-[(3-cholamidopropyl)dimethylammonio]-1-propanesulfonate) (CHAPS), or a combination of the above compounds. However, the inventive concept is not limited thereto.

In the thinner composition 152, a content of the surfactant may be about 0.01 wt % to about 15 wt % based on a total amount of the thinner composition 152.

In the thinner composition 152, the surfactant may improve the effect of removing the edge bead portion 130E by the thinner composition 152. The surfactant has a structure in which two chemical functional groups with different characteristics, that is, a hydrophilic functional group and a hydrophobic functional group, are included in one molecule. Therefore, when operation P10B of FIG. 1 is performed, while the thinner composition 152 dissolves the edge bead portion 130E of the photoresist layer 130, a hydrophobic site of the surfactant is physically adsorbed onto a surface of the photoresist layer 130 so that the surface of the photoresist layer 130 may become hydrophobic. The surface of the substrate 110, exposed after the edge bead portion 130E is removed, becomes hydrophobic due to the surfactant. In the photoresist layer 130, a portion removed from the edge portion 110E of the substrate 110 may be dissolved in a hydrophilic state by the thinner composition 152. Therefore, it is possible to prevent a resultant material obtained by dissolving the edge bead portion 130E into the thinner composition 152 from being re-deposited on the substrate 110 and to prevent defects caused by the re-deposition, for example, problems such as tailing and scum, from occurring.

The chelating agent may chelate metal ions. The chelating agent may be formed of an amino polycarboxylic acid-based chelating agent, an aromatic or aliphatic carboxylic acid-based chelating agent, an amino acid-based chelating agent, an ether polycarboxylic acid-based chelating agent, a phosphonic acid-based chelating agent, a hydroxycarboxylic acid-based chelating agent, a phosphoric acid-based chelating agent, a polymer electrolyte-based chelating agent, dimethyl glyoxime (DG), or a combination of the above materials.

For example, the chelating agent may be formed of iminodimethyl phosphonic acid (IDP), alkyl diphosphonic acid (ADPA), ethylenediaminetetraacetic acid (EDTA), cyclohexanediaminetetraacetic acid (CDTA), nitrilotriacetic acid (NTA), ethylenediamine, dimercaprol, citric acid, dithiooxamide, diphenylthiocarbazide, dithiozone, cupferron, petane-2,4-dione, iminodiacetic acid (IDA), N-(2-hydroxyethyl)iminodiacetic acid (HIMDA), diethylenetriaminepentaacetic acid (DTPA), N-(2-hydroxyethyl)ethylenediaminetriacetic acid (EDTA-OH), glycoletherdiaminetetraacetic acid (GEDTA), sodium ethylenediaminetetraacetate, sodium nitrilotriacetate, ammonium nitrilotriacetate, hydroxyethyl ethylenediaminetriacetic acid, sodium hydroxyethyl ethylenediaminetriacetate, diethylenetriaminepentaacetic acid, sodium diethylenetriaminepentaacetate, triethylenetetraaminehexaacetic acid, sodium triethylenetetraaminehexaacetate, or a combination of the above compounds. However, the inventive concept is not limited thereto.

In the thinner composition 152, a content of the chelating agent may be about 0.01 wt % to about 15 wt % based on the total amount of the thinner composition 152.

Figure 2E:
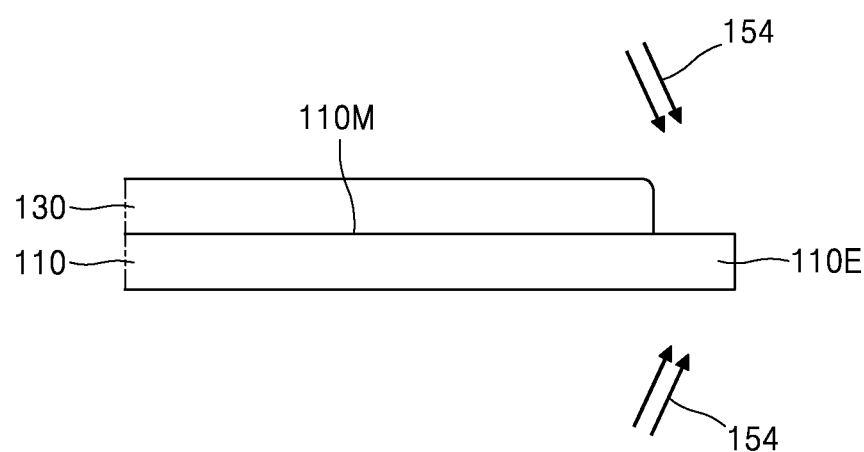

Referring to FIGS. 1 and 2E, in operation P10C, with respect to the resultant material of FIG. 2D, the substrate 110 is processed by using a main treatment composition 154 including the organic solvent, acid, and water. A process of processing the substrate 110 by using the main treatment composition 154 in accordance with operation P10C of FIG. 1 may be continuously performed in-situ after performing a process of removing the edge bead portion 130E of the photoresist layer 130 by using the thinner composition 152 in accordance with operation P10B of FIG. 1.

In order to process the substrate 110 in accordance with operation P10C, the main treatment composition 154 may be supplied to the edge portion 110E of the substrate 110. After removing the edge bead portion 130E of the photoresist layer 130 in accordance with operation P10B of FIG. 1, by supplying the main treatment composition 154 to the edge portion 110E of the substrate 110 in accordance with operation P10C of FIG. 1, metal atoms or metallic impurities including the metal atoms, which may reside on a surface of the edge portion 110E of the substrate 110 and a surface of process equipment around the substrate 110, may be effectively removed.

A detailed configuration of the organic solvent that may be included in the main treatment composition 154 is almost the same as or similar to the organic solvent that may be included in the photoresist composition with reference to FIG. 2B.

In some embodiments, the composition of the organic solvent included in the main treatment composition 154 used in operation P10C of FIG. 1 may be the same as or similar to that of the organic solvent included in the photoresist composition. In some embodiments, the composition of the organic solvent included in the main treatment composition 154 used in operation P10C of FIG. 1 may be different from that of the organic solvent included in the photoresist composition. For example, the organic solvent included in the main treatment composition 154 may be formed of a combination of PGME and PGMEA. For example, in the organic solvent, the weight ratio between PGME and PGMEA may be about 1:9 to about 9:1.

Water included in the main treatment composition 154 may dissociate acid included in the main treatment composition 154. Acid included in the main treatment composition 154 reacts to metal atoms or a metal atom in the presence of water and may remove the metal atoms or the metallic impurities that may remain on the surface of the edge portion 110E of the substrate 110 or the surface of the process equipment after the edge bead portion 130E of the photoresist layer 130 is removed.

A content of water that may be included in the main treatment composition 154 may be greater than about 0 wt % and no more than about 5 wt % based on the total amount of the main treatment composition 154. For example, in the main treatment composition 154, the content of water may be about 10 ppm to about 5 wt % based on the total amount of the main treatment composition 154. When the content of water included in the main treatment composition 154 is small, dissociating ability of acid included in the main treatment composition 154 deteriorates so that the metal atoms or the metallic impurities that may remain on the surface of the edge portion 110E of the substrate 110 or the surface of the process equipment may not be removed. When the content of water included in the main treatment composition 154 is large, due to components vulnerable to moisture included in the photoresist layer 130 that is to remain on the main surface 110M of the substrate 110, defects may occur in the photoresist layer 130.

A kind of acid that may be included in the main treatment composition 154 is not limited. Various kinds of acids that may react to the metal atom in the presence of water may be used. The acid may be formed of organic acid, inorganic acid, or a combination of the above acids.

In some embodiments, the acid may include at least one carboxyl group. For example, the acid may be acetic acid, citric acid, glutaric acid, formic acid, lactic acid, malic acid, maleic acid, oxalic acid, phthalic acid, succinic acid, tartaric acid, propionic acid, 2-nitrophenylacetic acid, 2-ethylhexanoic acid, dodecanoic acid, ascorbic acid, tartaric acid, glucuronic acid, or a combination of the above acids.

In the main treatment composition 154, the content of the acid may be about 0.5 wt % to about 95 wt % based on the total amount of the main treatment composition 154. For example, in the main treatment composition 154, the content of the acid may be about 0.5 wt % to about 20 wt %.

In some embodiments, the main treatment composition 154 may be formed of only the organic solvent and the acid. In this case, in the main treatment composition 154, the content of the organic solvent may be about 5 wt % to about 99.5 wt %.

In some embodiments, the composition of the organic solvent included in the main treatment composition 154 used in operation P10C of FIG. 1 may be the same as that of the organic solvent included in the thinner composition 152 (refer to FIG. 2C) used in operation P10B of FIG. 1. In some embodiments, the composition of the organic solvent included in the main treatment composition 154 used in operation P10C of FIG. 1 may be different from that of the organic solvent included in the thinner composition 152 used in operation P10B of FIG. 1. For example, the main treatment composition 154 may include the organic solvent formed of the combination of PGME and PGMEA. In the organic solvent, the weight ratio between PGME and PGMEA may be about 15:80. For example, the main treatment composition 154 may be formed of oxalic acid of about 5 wt %, water of about 2 wt %, and the organic solvent of a remaining amount. This main treatment composition 154 is an example combination, and the inventive concept is not limited thereto.

In some embodiments, the main treatment composition 154 may further include at least one additional compound selected from an alcohol compound, $H_2O_2$, and HF. In the main treatment composition 154, a content of the additional compound may be about 0.5 wt % to about 90 wt %. For example, in the main treatment composition 154, the content of the additional compound may be about 0.5 wt % to about 20 wt %. When the additional compound is further included in the main treatment composition 154, the content of the organic solvent may be the remaining amount excluding the acid, water, and additional compound.

The alcohol compound may be ethanol, propanol, isopropyl alcohol, isobutyl alcohol, hexanol, ethylene glycol, 1,2-propandiol(propylene glycol), 1,3-propandiol, 1,4-pentandiol, 1,5-pentandiol, 1,2-butandiol, 1,4-butandiol, 1,3-butandiol, catechol, methyl catechol, ethyl catechol, t-butyl catechol, or a combination of the above compounds.

When at least one additional compound selected from the alcohol compound, $H_2O_2$, and HF is further included in the main treatment composition 154, the additional compound may react with the metal atoms or the metal atom like the acid included in the main treatment composition 154 and may remove the metal atoms or the metallic impurities that may remain on the surface of the edge portion 110E of the substrate 110 or the surface of the process equipment after the removal of the edge bead portion 130E of the photoresist layer 130.

In some embodiments, the main treatment composition 154 may further include at least one compound selected from benzene sulfonic acid, p-toluenesulphonic acid, bis(2-ethylhexyl)phosphoric acid, and a combination of the above compounds.

In some embodiments, the main treatment composition 154 may further include at least one inorganic acid selected from nitric acid, sulfuric acid, HCl, phosphoric acid, hexafluorosilicic acid, hexafluorophosphoric acid, fluoroboric acid, and a combination of the above acids.

In some embodiments, the main treatment composition 154 may further include at least one selected from a surfactant and a chelating agent. Detailed configurations of the surfactant and the chelating agent are almost the same as described for the surfactant and the chelating agent included in the thinner composition 152 with reference to FIG. 2C. In the main treatment composition 154, a content of each of the surfactant and the chelating agent may be about 0.01 wt % to about 15 wt %, based on the total amount of the main treatment composition 154.

Figure 3:
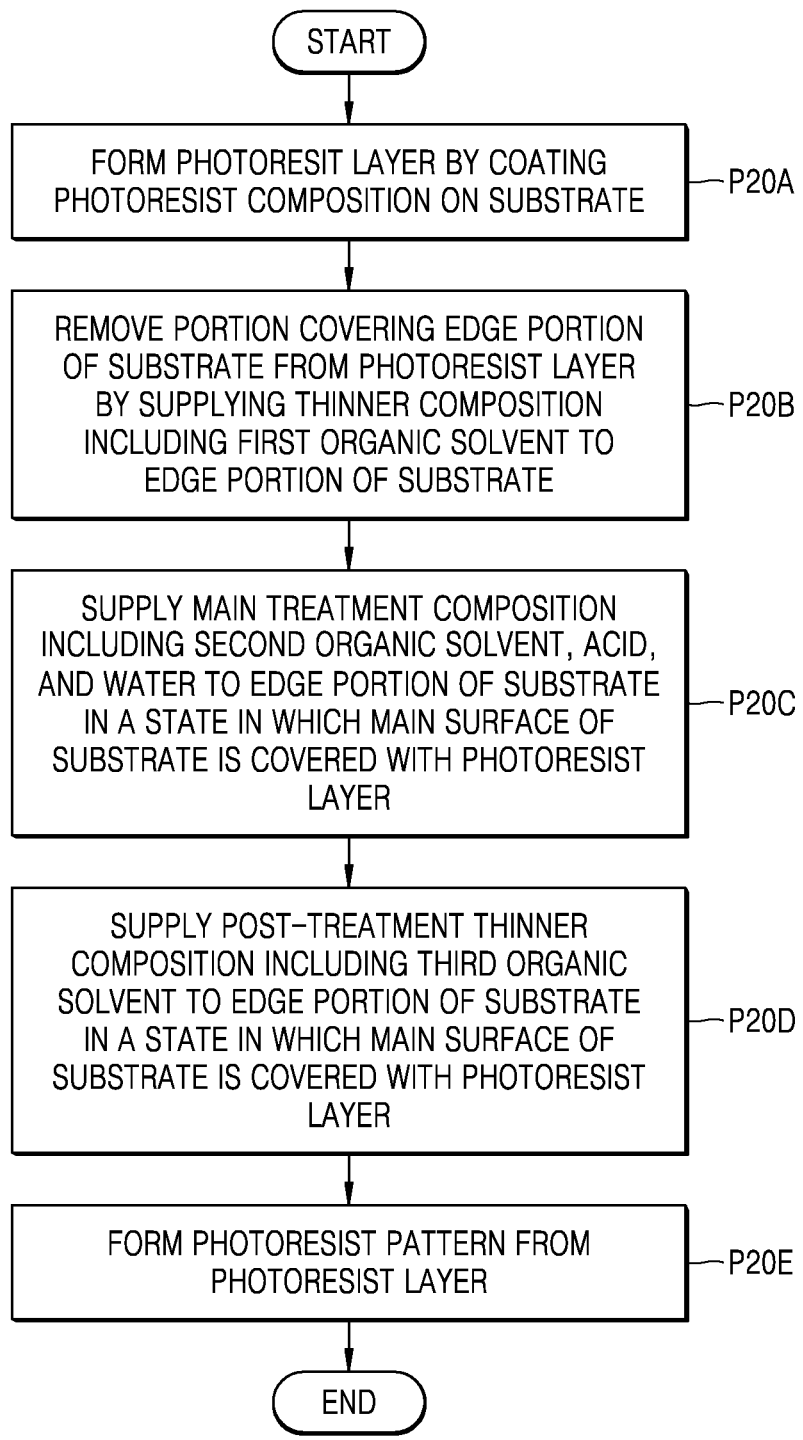
FIG. 3 is a flowchart illustrating a method of manufacturing an integrated circuit device, according to some embodiments of the inventive concept.

FIG. 3 is a flowchart illustrating a method of manufacturing an integrated circuit device, according to some embodiments of the inventive concept.

FIGS. 4A to 4E are cross-sectional views illustrating partial processes of the method of manufacturing an integrated circuit device of FIG. 3 in the order of processes.

Figure 4A:
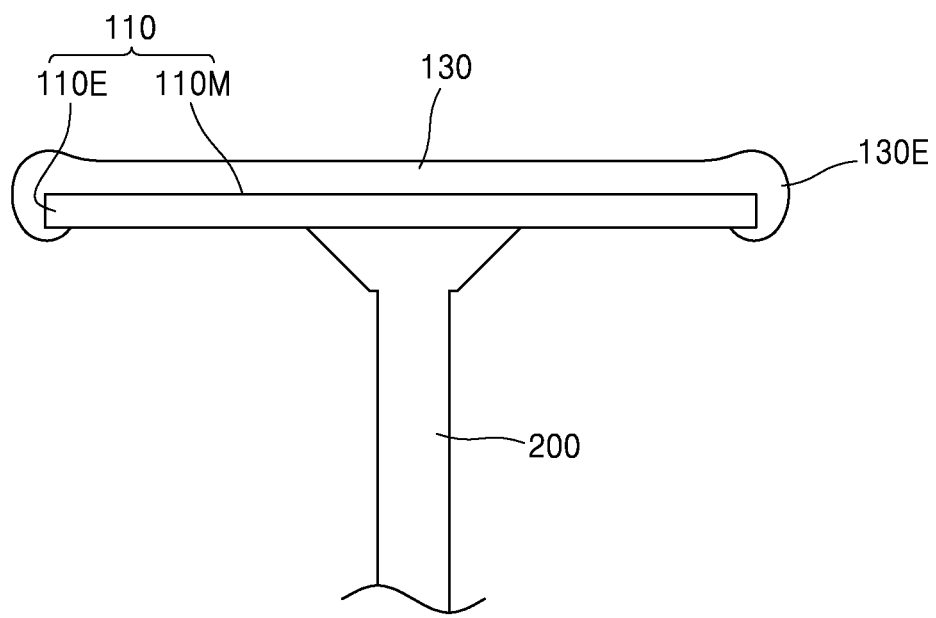
FIGS. 4A to 4E are cross-sectional views illustrating partial processes of the method of manufacturing an integrated circuit device of FIG. 3 in the order of processes, according to some embodiments of the inventive concept.

Referring to FIGS. 3 and 4A, in operation P20A, the substrate 110 having the main surface 110M and the edge portion 110E surrounding the main surface 110M is loaded on a spin plate 200 provided in a spin coating chamber. After loading the substrate 110, and then coating the photoresist composition on the substrate 110, the photoresist layer 130 is formed.

While applying the photoresist composition onto the substrate 110 in order to form the photoresist layer 130, the spin plate 200 may rotate. Therefore, as described for operation P10A with reference to FIGS. 1 and 2B, after the photoresist layer 130 is formed, on the edge portion 110E of the substrate 110, the edge bead portion 130E of the photoresist layer 130 may be formed. Detailed description of the formation of the photoresist layer 130 is the same as or similar to the description for operation P10A of FIG. 1.

Figure 4B:
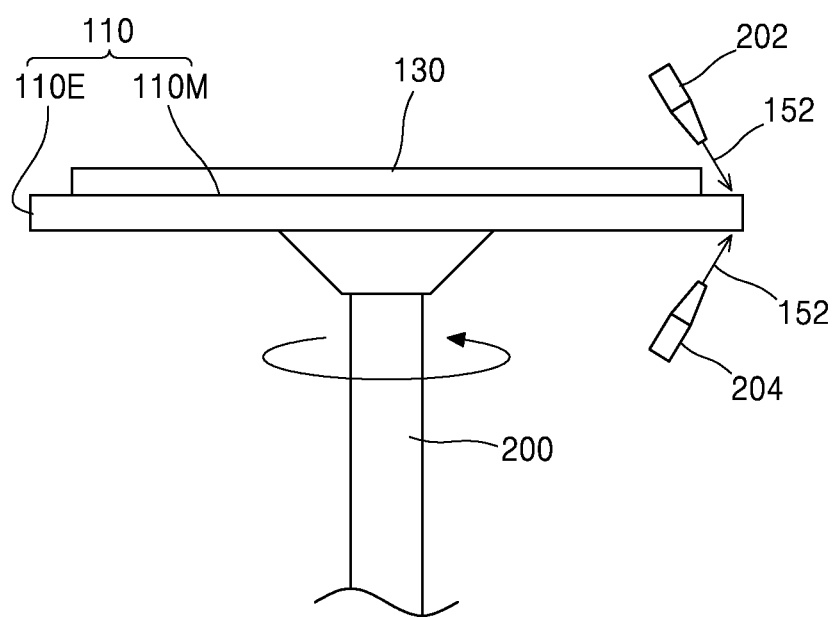

Referring to FIGS. 3 and 4B, in operation P20B, by supplying the thinner composition 152 including a first organic solvent to the edge portion 110E of the substrate 110, the edge bead portion 130E covering or on the edge portion 110E of the substrate 110 is removed from the photoresist layer 130.

A detailed configuration of the thinner composition 152 is the same as to similar to the description for operation P10B with reference to FIGS. 1 and 2C. A detailed configuration of the first organic solvent that may be included in the thinner composition 152 is almost the same as or similar to the one described for the organic solvent that may be included in the photoresist composition with reference to FIG. 2B.

In order to supply the thinner composition 152 including the first organic solvent to the edge portion 110E of the substrate 110, an injecting device including a first injector 202 and a second injector 204 may be used. Through the first injector 202 and the second injector 204, the thinner composition 152 may be applied to upper and lower sides of the edge portion 110E of the substrate 110.

While removing the edge bead portion 130E by supplying the thinner composition 152 to the edge portion 110E of the substrate 110, the spin plate 200 may rotate at a speed of about 150 rpm to about 250 rpm. As the spin plate 200 rotates, outlets of the first injector 202 and/or the second injector 204 may be directed to the upper and lower sides of the substrate 110 toward the edge portion 110E. The thinner composition 152 discharged from the first injector 202 and the second injector 204 may be injected onto points apart from the outermost circumference at the upper and lower sides of the substrate 110 toward the center of the substrate 110 by about 0.5 mm to about 2 mm, such as, for example, by about 1 mm. The thinner composition 152 may be supplied to the edge portion 110E of the substrate 110 for about 2 seconds to about 2 minutes, for example, about 30 seconds while rotating the spin plate 200 in a state in which the substrate 110 is put on the spin plate 200. For example, the thinner composition 152 may be formed of the combination of PGME and PGMEA. For example, the thinner composition 152 may be formed of PGME of about 40 wt % and PGMEA of about 60 wt %, which is an example combination. The inventive concept is not limited thereto.

Figure 4C:
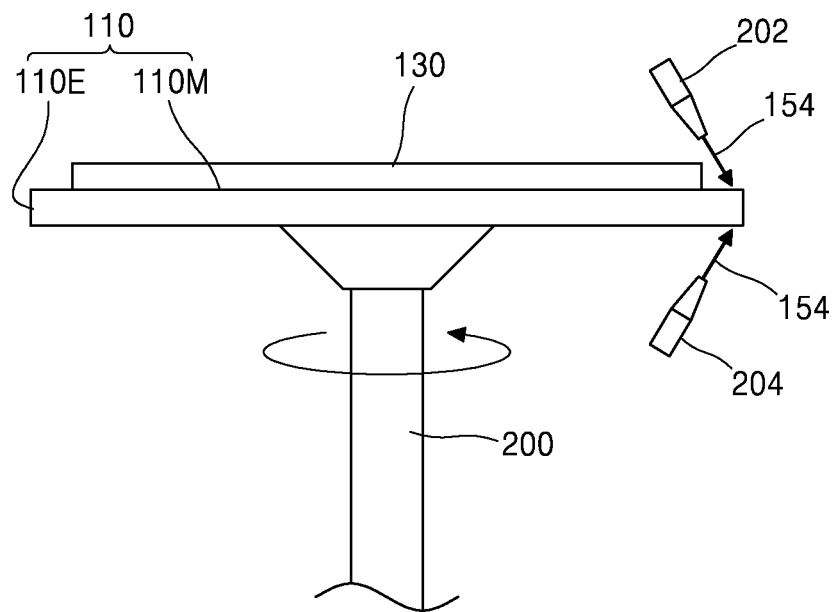

Referring to FIGS. 3 and 4C, in operation P20C, in a state in which the main surface 110M of the substrate 110 is covered with or overlapped by the photoresist layer 130, the main treatment composition 154 including a second organic solvent, acid, and/or water are supplied to the edge portion 110E of the substrate 110.

A process of supplying the main treatment composition 154 to the edge portion 110E of the substrate 110 in accordance with operation P20C of FIG. 3 may be continuously performed in-situ after performing a process of supplying the thinner composition 152 to the edge portion 110E of the substrate 110 in accordance with operation P20B of FIG. 3.

After removing the edge bead portion 130E of the photoresist layer 130 in accordance with operation P20B of FIG. 3, by supplying the main treatment composition 154 to the edge portion 110E of the substrate 110 in accordance with operation P20C of FIG. 3, the metal atoms or the metallic impurities including the metal atoms, which may reside on the surface of the edge portion 110E of the substrate 110 and the surface of the process equipment around the edge portion 110E of the substrate 110, may be effectively removed.

A detailed configuration of the second organic solvent that may be included in the main treatment composition 154 may be almost the same as or similar to the one described for the first organic solvent that may be included in the thinner composition 152 used in operation P20B with reference to FIGS. 3 and 4B. In some embodiments, a composition of the second organic solvent may be the same as or similar to that of the first organic solvent. In some embodiments, the composition of the second organic solvent may be different from that of the first organic solvent.

In some embodiments, in the second organic solvent, the weight ratio between PGME and PGMEA may be about 15:80. For example, the main treatment composition 154 may be formed of oxalic acid of about 5 wt %, water of about 2 wt %, and the organic solvent of the remaining amount, which is an example combination. The inventive concept is not limited thereto.

In some embodiments, the main treatment composition 154 may further include at least one selected from the surfactant and the chelating agent. In some embodiments, the main treatment composition 154 may further include at least one additional compound selected from the alcohol compound, $H_2O_2$, and HF. Detailed description of the main treatment composition 154 is almost the same as described for the main treatment composition 154 used in operation P10C with reference to FIGS. 1 and 2E.

In order to supply the main treatment composition 154 to the edge portion 110E of the substrate 110, the injecting device including the first injector 202 and the second injector 204 may be used. Through the first injector 202 and the second injector 204, the main treatment composition 154 may be applied to the upper and lower sides of the edge portion 110E of the substrate 110.

While supplying the main treatment composition 154 to the edge portion 110E of the substrate 110, the spin plate 200 may rotate at the speed of about 150 rpm to about 250 rpm. While the spin plate 200 is rotating, the outlets of the first injector 202 and the second injector 204 are directed towards the upper and lower sides of the substrate 110 toward the edge portion 110E. The main treatment composition 154 discharged from the first injector 202 and the second injector 204 may be injected onto points apart from the outermost circumference at the upper and lower sides of the substrate 110 toward the center of the substrate 110 by about 0.5 mm to about 2 mm, for example, by about 1 mm. The main treatment composition 154 may be supplied to the edge portion 110E of the substrate 110 for about 10 seconds to about 2 minutes, for example, about 1 minute while rotating the spin plate 200 in the state in which the substrate 110 is put on the spin plate 200.

Figure 4D:
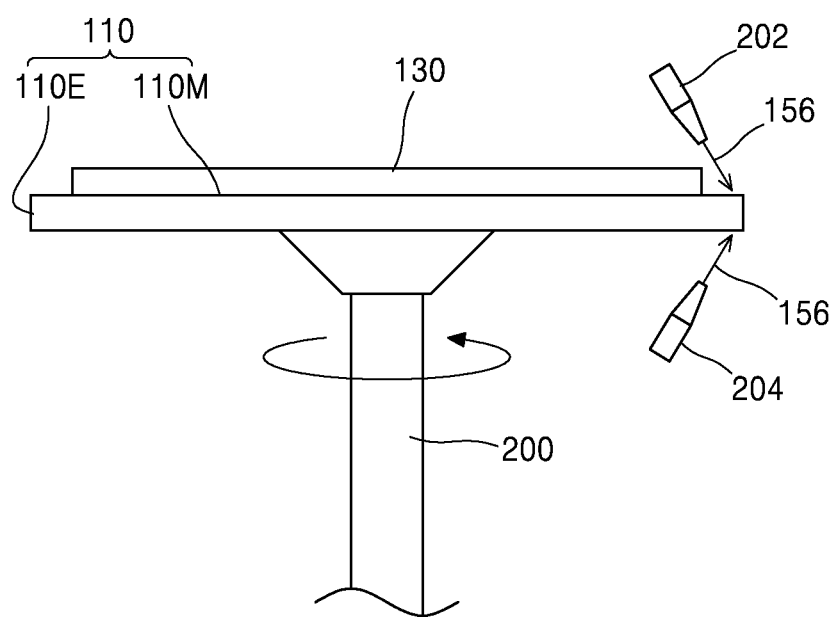

Referring to FIGS. 3 and 4D, in operation P20D, in the state in which the main surface 110M of the substrate 110 is covered with the photoresist layer 130, a post-treatment thinner composition 156 including a third organic solvent is supplied to the edge portion 110E of the substrate 110.

A process of supplying the post-treatment thinner composition 156 to the edge portion 110E of the substrate 110 in accordance with operation P20D of FIG. 3 may be continuously performed in-situ after performing a process of supplying the main treatment composition 154 to the edge portion 110E of the substrate 110 in accordance with operation P20C of FIG. 3.

By supplying the post-treatment thinner composition 156 to the edge portion 110E of the substrate 110, after supplying the main treatment composition 154 to the edge portion 110E of the substrate 110 in accordance with operation P20C of FIG. 3, the residue of the main treatment composition 154 left in the edge portion 110E of the substrate 110 may be removed from the substrate 110. Therefore, reactive impurities such as acid residue generated by the main treatment composition 154, which may remain on the surface of the edge portion 110E of the substrate 110 and the surface of the process equipment around the edge portion 110E of the substrate 110, may be effectively removed.

A detailed configuration of the third organic solvent that may be included in the post-treatment thinner composition 156 is almost the same as or similar to that described for the first organic solvent that may be included in the thinner composition 152 used in operation P2OB with reference to FIGS. 3 and 4B. In some embodiments, a composition of the third organic solvent may be the same as or similar to that of the first organic solvent. In some embodiments, the composition of the third organic solvent may be different from that of the first organic solvent.

In some embodiments, the post-treatment thinner composition 156 may be formed of only the third organic solvent. In some embodiments, the post-treatment thinner composition 156 may be formed of a combination of the third organic solvent and water. In some embodiments, the post-treatment thinner composition 156 may further include at least one selected from the surfactant and the chelating agent. For example, the post-treatment thinner composition 156 may be formed of ethyl lactate of about 99 wt % and polyoxy ethylene glycol octyl phenol ether (Triton™ X-100) of about 1 wt %, which is an example combination. The inventive concept is not limited thereto. Detailed description of the post-treatment thinner composition 156 is almost the same as or similar to that described for the thinner composition 152 used in operation P10B with reference to FIGS. 1 and 2C.

In order to supply the post-treatment thinner composition 156 including the third organic solvent to the edge portion 110E of the substrate 110, the injecting device including the first injector 202 and the second injector 204 may be used. Through the first injector 202 and the second injector 204, the post-treatment thinner composition 156 may be applied to the upper and lower sides of the edge portion 110E of the substrate 110.

While the post-treatment thinner composition 156 is supplied to the edge portion 110E of the substrate 110, the spin plate 200 may rotate at the speed of about 150 rpm to about 250 rpm. At this time, the outlets of the first injector 202 and the second injector 204 may be directed towards the upper and lower sides of the substrate 110 toward the edge portion 110E. The post-treatment thinner composition 156 discharged from the first injector 202 and the second injector 204 may be injected onto points apart from the outermost circumference at the upper and lower sides of the substrate 110 toward the center of the substrate 110 by about 0.5 mm to about 2 mm, for example, by about 1 mm. The post-treatment thinner composition 156 may be supplied to the edge portion 110E of the substrate 110 for about 2 seconds to about 1 minute, for example, about 20 seconds while rotating the spin plate 200 in the state in which the substrate 110 is put on the spin plate 200.

After performing the process of operation P20D of FIG. 3, a drying process for removing the post-treatment thinner composition 156 that resides in the edge portion 110E of the substrate 110 by rotating the spin plate 200 at a speed of about 500 rpm to about 1500 rpm in the state in which the substrate 110 is put on the spin plate 200 may be performed.

Figure 4E:
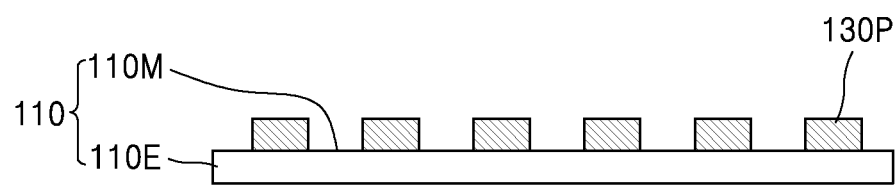

Referring to FIGS. 3 and 4E, in operation P20E, a photoresist pattern 130P is formed from the photoresist layer 130 on the substrate 110 illustrated in FIG. 4D that undergoes operation P20D of FIG. 3.

FIG. 5 is a flowchart illustrating an example method of forming the photoresist pattern 130P illustrated in FIG. 4E in accordance with operation P20E of FIG. 3.

FIGS. 6A to 6E are cross-sectional views illustrating an example method of forming the photoresist pattern 130P from the photoresist layer 130 on the substrate 110 in the order of processes. In FIGS. 6A to 6E, processes of forming the photoresist pattern 130P from the photoresist layer 130 on the partial area of the substrate 110 are illustrated.

Referring to FIGS. 5 and 6A, in operation P30A, the photoresist layer 130 is soft baked. By soft baking the photoresist layer 130, a solvent is removed from the photoresist layer 130 so that the photoresist layer 130 may be transformed to be solid. The photoresist layer 130 may be soft baked at a temperature of about 70° C. to about 150° C.

Referring to FIGS. 5 and 6B, in operation P30B, a partial area of the photoresist layer 130 is exposed.

In order to expose the partial area of the photoresist layer 130, a photo-mask 140 having a plurality of light shielding areas LS and a plurality of light transmitting areas LT may be aligned in a predetermined position on the photoresist layer 130 and the partial area of the photoresist layer 130 may be exposed through the plurality of light transmitting areas LT of the photo-mask 140. In order to expose the partial area of the photoresist layer 130, KrF excimer laser of 248 nm, ArF excimer laser of 193 nm, $F_2$ excimer laser of 157 nm, or extreme ultraviolet (EUV) laser of 13.5 nm may be used.

The photo-mask 140 may include a transparent substrate 142 and a plurality of light shielding patterns 144 formed in the plurality of light shielding areas LS on the transparent substrate 142. The transparent substrate 142 may be formed of quartz. The plurality of light shielding patterns 144 may be formed of Cr. The plurality of light transmitting areas LT may be defined by the plurality of light shielding patterns 144.

After the photoresist layer 130 is exposed, the photoresist layer 130 may include an exposure area 132 and a non-exposed area 134. In some embodiments, the photoresist layer 130 may be formed of a metal-containing photoresist layer obtained from the metal-containing photoresist composition described with reference to FIGS. 1 and 2B and the exposure process may be performed by using an EUV laser of 13.5 nm. In this case, when the photoresist layer 130 is exposed by using an EUV laser, photons are absorbed into a metal structure in the metal-containing photoresist layer in the exposure area 132 of the photoresist layer 130 so that secondary electrons may be generated in the exposure area 132. The secondary electrons may destroy a combination between organic ligands and a metal core that form the metal structure in the exposure area 132 so that the metal structures in the exposure area 132 may be clustered to metal oxide through condensation that forms an M-O-M combination formed of a combination between a metal atom (M) and an oxygen atom (O). For example, in the exposure area 132 of the photoresist layer 130, metal oxide such as $SnO_2$ may be formed. As a result, the photoresist layer 130 may be dissolved by a developer with different solubilities in the exposure area 132 and the non-exposed area 134.

After performing an exposure process in accordance with operation P30B of FIG. 5, a post exposure bake (PEB) process may be performed. The PEB process may be performed at a temperature of about 70° C. to about 150° C.

Figure 6C:
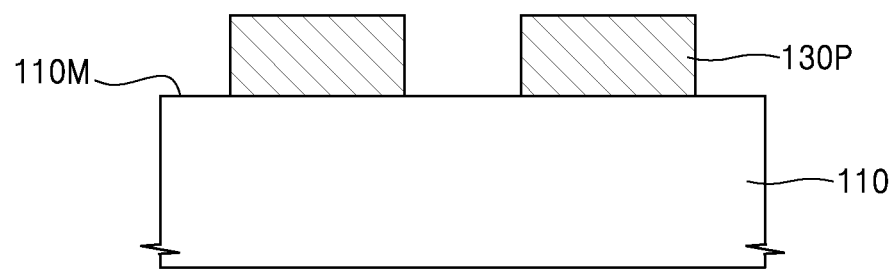

Referring to FIGS. 5 and 6C, in operation P30C, the photoresist pattern 130P is formed by developing the exposed photoresist layer 130.

In some embodiments, the non-exposed area 134 of the photoresist layer 130 is removed by developing the exposed photoresist layer 130 illustrated in FIG. 6B and, as a result, the photoresist pattern 130P formed of the exposure area 132 of the photoresist layer 130 may be formed. In some embodiments, the development may be performed by a negative-tone development (NTD) process. At this time, as the developer, n-butyl acetate or 2-heptanone may be used. However, the kind of the developer is not limited thereto.

In some embodiments, unlike in FIG. 6C, by developing the exposed photoresist layer 130 illustrated in FIG. 6B by a positive-tone development (PTD) process, a photoresist pattern (not shown) formed of the non-exposed area 134 of the photoresist layer 130 may be formed.

In some embodiments, in order to perform a development process in accordance with operation P30C of FIG. 5, various developers may be used. For example, as the developer, 2-octanone, 2-nonanone, 2-heptanone, 3-heptanone, 4-heptanone, 2-hexanone, 3-hexanone, diisobutyl ketone, methyl cyclohexanone, acetophenone, methyl acetophenone, propyl acetate, butyl acetate, isobutyl acetate, amyl acetate, butenyl acetate, isoamyl acetate, phenyl acetate, propyl formate, butyl formate, isobutyl formate, amyl formate, isoamyl formate, methyl valerate, methyl pentenate, methyl crotonate, ethyl crotonate, methyl propionate, ethyl propionate, 3-ethoxyethyl propionate, methyl lactate, ethyl lactate, propyl lactate, butyl lactate, isobutyl lactate, amyl lactate, isoamyl lactate, 2-hydroxymethyl isobutyrate, ethyl-2-hydroxy isobutyrate, methyl benzoate, ethyl benzoate, phenyl acetate, benzyl acetate, phenylmethyl acetate, benzyl formate, phenylethyl formate, methyl-3-phenylpropionate, benzyl propionate, ethyl phenyl acetate, 2-phenylethyl acetate, or a combination of the above compounds may be used. However, the inventive concept is not limited thereto.

Figure 6D:
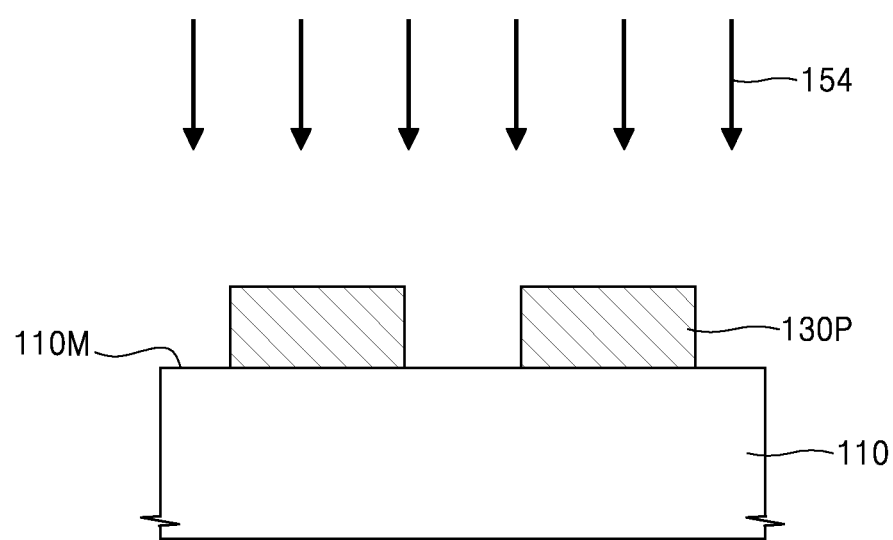

Referring to FIGS. 5 and 6D, in operation P30D, in a state in which the main surface 110M of the substrate 110 is covered by or at least partially overlapped by the photoresist pattern 130P, the main treatment composition 154 is supplied to the substrate 110.

A detailed configuration of the main treatment composition 154 is the same as described for the main treatment composition 154 used in operation P10C with reference to FIGS. 1 and 2E. By supplying the main treatment composition 154 to the substrate 110 on which the photoresist pattern 130P remains, after undergoing the development process in operation P30C described with reference to FIGS. 5 and 6C, the metal atoms or the metallic impurities including the metal atoms, that may reside on the substrate 110, may be effectively removed.

While the main treatment composition 154 is supplied to the substrate 110 in the state in which the main surface 110M of the substrate 110 is covered with the photoresist pattern 130P, the main treatment composition 154 may be applied to a surface of the photoresist pattern 130P. At this time, as described with reference to FIG. 6B, because the photoresist pattern 130P is changed into metal oxide through the condensation that forms the M-O-M combination after undergoing exposure, although the main treatment composition 154 contacts the photoresist pattern 130P, the photoresist pattern 130P may maintain a desired shape without being damaged or transformed.

Figure 6E:
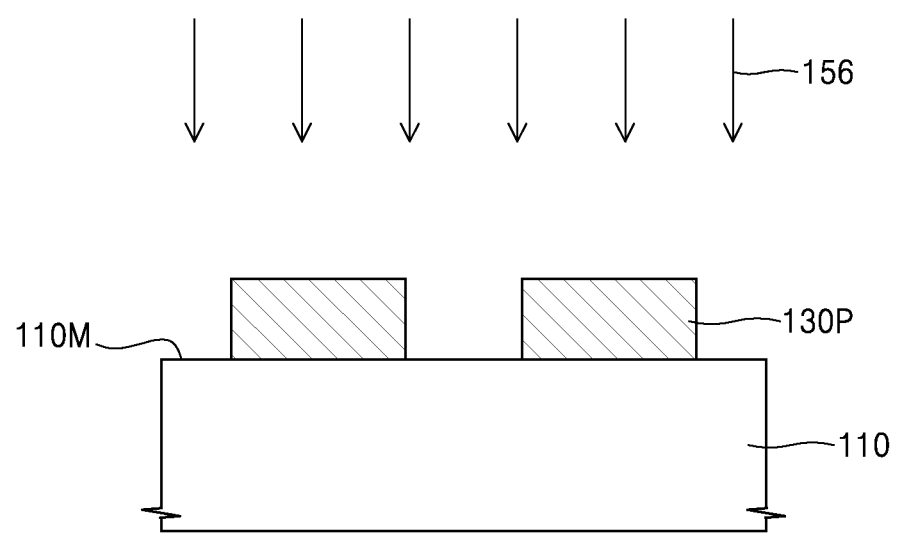

Referring to FIGS. 5 and 6E, in operation P30E, in the state in which the main surface 110M of the substrate 110 is covered or overlapped by the photoresist pattern 130P, the post-treatment thinner composition 156 is supplied to the substrate 110.

A detailed configuration of the post-treatment thinner composition 156 is the same as or similar to that described for the post-treatment thinner composition 156 used in operation P20D with reference to FIGS. 3 and 4D. By supplying the post-treatment thinner composition 156 to the substrate 110 in a state in which the main surface 110M of the substrate 110 is covered or overlapped by the photoresist pattern 130P, after supplying the main treatment composition 154 to the substrate 110 in accordance with operation P30D of FIG. 5, reactive impurities such as acid residue that may reside on the surface of the substrate 110 or the surface of the process equipment may be effectively removed.

While the post-treatment thinner composition 156 is supplied to the substrate 110 in the state in which the main surface 110M of the substrate 110 is covered or overlapped by the photoresist pattern 130P, the post-treatment thinner composition 156 may be applied to the surface of the photoresist pattern 130P. At this time, as described with reference to FIG. 6B, because the photoresist pattern 130P is changed into metal oxide through the condensation that forms the M-O-M combination after undergoing exposure, although the post-treatment thinner composition 156 contacts the photoresist pattern 130P, the photoresist pattern 130P may maintain a desired shape without being damaged or transformed.

Then, in the resultant material of FIG. 6E, a film to be processed, which is included in the substrate 110, is processed by using the photoresist pattern 130P.

For example, various processes such as a process of implanting impurity ions into the substrate 110 by using the photoresist pattern 130P, a process of etching the film to be processed of the substrate 110, a process of forming an additional film on the substrate 110, and a process of transforming a part of the film to be processed of the substrate 110 may be performed.

In the method of manufacturing an integrated circuit device according to the inventive concept, in processes of manufacturing the integrated circuit device using the photolithography process using the metal-containing photoresist composition, by suppressing substrate contamination and equipment contamination by metal, which are caused by the photoresist composition, it is possible to improve process efficiency and to prevent an electrical characteristic of the integrated circuit device from deteriorating.

While the inventive concept has been particularly shown and described with reference to embodiments thereof, it will be understood that various changes in form and details may be made therein without departing from the spirit and scope of the following claims.

What is claimed is:

1. A method of manufacturing an integrated circuit device, the method comprising:
   forming a metal-containing photoresist layer by coating a metal-containing photoresist composition on a substrate comprising a main surface and an edge portion around the main surface in a plan view;
   removing a portion of the metal-containing photoresist layer from the edge portion of the substrate by supplying a thinner composition to the edge portion of the substrate, the thinner composition consisting of a composition of propylene glycol methyl ether (PGME) and propylene glycol methyl ether acetate (PGMEA); and
   removing impurities from a surface of the substrate by supplying a main treatment composition comprising an organic solvent, acid, and water to the substrate after the removing of the portion of the metal-containing photoresist layer,
   wherein in the main treatment composition, the organic solvent includes a composition of PGME and PGMEA, and a content of water is about 10 ppm to about 5 wt % based on a total amount of the main treatment composition.

2. The method of claim 1,
   wherein the metal-containing photoresist composition comprises a metal structure comprising an organic metal compound, an organic metal nano-particle, and/or an organic metal cluster, and
   wherein the metal structure comprises a metal core including at least one metal atom and at least one organic ligand around the metal core.

3. The method of claim 1,
   wherein the removing of the impurities from the surface of the substrate is continuously performed in-situ after the removing of the portion of the metal-containing photoresist layer.

4. The method of claim 3, further comprising:
   after the removing of the impurities from the surface of the substrate, removing reactive impurities remaining on the edge portion of the substrate by supplying a post-treatment thinner composition to the edge portion of the substrate, the post-treatment thinner composition consisting of a composition of PGME and PGMEA.

5. The method of claim 1, wherein the main treatment composition further comprises an alcohol compound, $H_2O_2$, and/or HF.

6. The method of claim 1, wherein the main treatment composition further comprises a surfactant and/or a chelating agent.

7. The method of claim 1, further comprising:
   exposing a partial area of the metal-containing photoresist layer after the removing of the portion of the metal-containing photoresist layer; and
   forming a metal-containing photoresist pattern by developing the partial area of the metal-containing photoresist layer that was exposed,
   wherein the removing of the impurities from the surface of the substrate is performed before the exposing of the partial area of the metal-containing photoresist layer.

8. The method of claim 1, further comprising:
   exposing a partial area of the metal-containing photoresist layer after the removing of the portion of the metal-containing photoresist layer; and
   forming a metal-containing photoresist pattern by developing the partial area of the metal-containing photoresist layer that was exposed,
   wherein the removing of the impurities from the surface of the substrate is performed after the forming of the metal-containing photoresist pattern.

9. The method of claim 1, further comprising:
   performing a post exposure bake process in a temperature range of 70° C. to 150° C.

10. The method of claim 1, further comprising:
    aligning a photo-mask on the metal-containing photoresist layer,
    wherein the photo-mask comprises a plurality of light shielding patterns and a plurality of light transmitting patterns, and
    wherein the light transmitting patterns comprise quartz, and the plurality of light shielding patterns comprise Cr.

11. The method of claim 10,
    exposing a partial area of the metal-containing photoresist layer after the removing of the portion of the metal-containing photoresist layer by exposing the partial area through the plurality of light transmitting patterns of the photo-mask.

12. A method of manufacturing an integrated circuit device, the method comprising:
    forming a metal-containing photoresist layer by coating a metal-containing photoresist composition on a substrate having a main surface and an edge portion around the main surface in a plan view;
    supplying a thinner composition consisting of a composition of propylene glycol methyl ether (PGME) and propylene glycol methyl ether acetate (PGMEA) to the edge portion of the substrate to remove a portion of the metal-containing photoresist layer that is on the edge portion of the substrate;
    supplying a main treatment composition comprising an organic solvent, acid, and water to the edge portion of the substrate in a state in which the main surface of the substrate is overlapped by the metal-containing photoresist layer to remove metallic impurities from the edge portion of the substrate after the supplying of the thinner composition, wherein in the main treatment composition, the organic solvent includes a composition of PGME and PGMEA, and a content of water is about 10 ppm to about 5 wt % based on a total amount of the main treatment composition; and supplying a post-treatment thinner composition to the edge portion of the substrate in a state in which the main surface of the substrate is overlapped by the metal-containing photoresist layer to remove reactive impurities on the edge portion of the substrate after the supplying of the main treatment composition, the post-treatment thinner composition consisting of a composition of PGME and PGMEA.

* * * * *